(12) United States Patent
Rapp et al.

(10) Patent No.: US 6,461,948 B1
(45) Date of Patent: Oct. 8, 2002

(54) METHOD OF DOPING SILICON WITH PHOSPHORUS AND GROWING OXIDE ON SILICON IN THE PRESENCE OF STEAM

(75) Inventors: James E. Rapp, Oregon; Russell B. Rogenski, Toledo, both of OH (US)

(73) Assignee: Techneglas, Inc., Columbus, OH (US)

( * ) Notice: Subject to any disclaimer, the term of this patent is extended or adjusted under 35 U.S.C. 154(b) by 0 days.

(21) Appl. No.: 09/538,558

(22) Filed: Mar. 29, 2000

(51) Int. Cl.[7] .......................... H01L 21/22; H01L 21/38; H01L 21/31; H01L 21/469
(52) U.S. Cl. ........................ 438/558; 438/567; 438/773
(58) Field of Search ................................ 438/558, 542, 438/567, 770, 773, 768, 787

(56) References Cited

U.S. PATENT DOCUMENTS 3,931,056 A * 1/1976 Myles et al. ................ 252/520
4,028,150 A * 6/1977 Collins et al. .............. 148/187
4,441,247 A * 4/1984 Gargini et al. ................ 29/571

* cited by examiner

Primary Examiner—Michael S. Lebentritt
Assistant Examiner—Adam Pyonin
(74) Attorney, Agent, or Firm—Porter, Wright, Morris & Arthur LLP (57) ABSTRACT

A method of doping silicon that involves placing a silicon wafer in spaced relationship to a solid phosphorus dopant source at a first temperature for a time sufficient to deposit a phosphorus-containing layer on the surface of the wafer and subsequently oxidizing the doped silicon wafer with wet oxygen or pyrogenic steam at a second temperature lower than the first temperature. The silicon wafer is maintained in spaced relationship to the solid phosphorus dopant source during the oxidizing step. The temperatures are selected such that the solid phosphorus dopant source evolves $P_2O_5$ at the first temperature and the second temperature is sufficiently lower than the first temperature to decrease evolution of $P_2O_5$ from the solid phosphorus dopant source during the oxidizing step.

30 Claims, 5 Drawing Sheets

METHOD OF DOPING SILICON WITH PHOSPHORUS AND GROWING OXIDE ON SILICON IN THE PRESENCE OF STEAM

BACKGROUND OF THE INVENTION

The present invention is concerned generally with methods of doping a silicon wafer with phosphorus and subsequently growing an oxide on the doped silicon wafer. More particularly, the present invention is concerned with a method of doping a silicon wafer with phosphorus using a solid dopant source and then growing an oxide layer on the surface of the doped silicon wafer in pyrogenic steam or in a wet oxygen environment in the presence of the solid phosphorus source to accomplish an in situ oxidation of the doped silicon surface. As used herein, "in situ oxidation" means oxidation of the doped silicon in the presence of the solid dopant sources.

Several conventional methods of doping silicon wafers exist. In one of these methods, the silicon wafer is first doped at a high temperature, usually ranging from about 950–1150° C., using phosphorus oxychloride ($POCl_3$) or phosphine ($PH_3$). The gaseous $POCl_3$ or $PH_3$ is carried down the diffusion tube with nitrogen containing some oxygen. This results in the deposition of phosphorus oxide on the silicon surface. The phosphorus oxide then reacts with the silicon surface to form elemental phosphorus, which in turn diffuses to a controlled depth within the silicon wafer. Immediately following the deposition is a steam oxidation of the doped silicon wafer, usually near the deposition temperature, for about 30–60 minutes to grow the desired oxide. Generally, the concentration and the depth of the diffused phosphorus within the silicon wafer are proportional to the time and temperature of the entire deposition process. The thickness of the resulting oxide layer formed on the surface of the silicon wafer during the steam oxidation step is proportional to the time and temperature in steam.

There are a number of difficulties associated with the use of $POCl_3$ and $PH_3$. These include non-uniform doping of large diameter silicon wafers (because the dopant gas cannot easily get between the silicon wafers), generation of particles in the diffusion tube that cause silicon damage, toxicity and corrosivity of the gases, and other handling difficulties.

Solid dopant sources that evolve phosphorus pentoxide ($P_2O_5$) upon heating, such as those described in U.S. Pat. No. 3,998,668 to Florence et al., were developed to overcome some of the problems associated with gaseous dopants. The $P_2O_5$ is deposited on the silicon wafers during the deposition step. U.S. Pat. Nos. 4,175,988, and 4,141,738 to Rapp, the contents of which are incorporated herein by reference, describe exemplary solid dopant sources and methods of using the solid dopant sources to dope a silicon wafer.

One method of doping silicon wafers using solid dopant sources involves doping the silicon wafer at about 1050° C. followed by an in situ oxidation with dry oxygen at about the same temperature. During the deposition step, the silicon wafers are placed with their surfaces parallel and in close proximity to the surfaces of adjacent solid dopant sources, e.g., in a solid dopant source boat. The solid dopant sources and silicon wafers are inserted into a diffusion tube and heated to the deposition temperature under nitrogen using a conventional furnace ramping technique. The oxidation of the doped silicon wafers can be done in situ at temperatures near 1050° C. because dry oxygen does not change the evolution rate of the sources.

When silicon wafers are doped using solid dopant sources followed by oxidation with dry oxygen, much more time is required to produce the desired oxide thickness because oxygen oxidizes the silicon more slowly than steam. This longer oxidation time at about 1050° C. also results in excessive diffusion of phosphorus into the silicon wafer. Unless the desired junction is very deep, the additional diffusion time results in too deep of a junction and often destroys the device being made.

Another method of doping silicon using solid dopant sources involves doping the silicon wafers at about 1050° C., removing the silicon wafers from proximity to the solid dopant sources, and oxidizing the silicon wafers with steam. After deposition, the silicon wafers are removed from the boat (and proximity to the solid dopant sources) and re-inserted into the diffusion furnace for the steam oxidation. The separate steam oxidation can be done at temperatures similar to those in the first method described above to grow the desired oxide. The solid dopant sources must be isolated from the silicon wafers during steam oxidation because moisture at high temperatures causes $P_2O_5$ to evolve rapidly from the source. This method yields satisfactory results but is time consuming and requires much operator handling. It also exposes the hygroscopic silicon surface containing $P_2O_5$ to humid room air, which can produce silicon surface damage.

The thickness of the oxide layer desired on a silicon wafer may vary with the application from a few hundred angstroms (Å) to 20,000 Å or more. In most emitter diffusions, the oxide thickness will be in the range of about 1500–6000 Å and preferably in the range of about 2000–5000 Å. A typical emitter diffusion will require an oxide thickness of about 4300–5000 Å. Oxide layers of the preferred thickness for emitter diffusions typically are grown at or near the deposition temperature, which typically is in the range of about 950–150° C. Acceptable sheet resistivities for emitter diffusions typically are in the range of about 5.35–6.15 ohms/sq. but may be as high as about 15 ohms/sq. and as low as about 1 ohm/sq. For example, a deposition temperature and time of around 1025° C. for 60 minutes commonly is used for bipolar transistors to give sheet resistivities of about 5 ohms/sq.

It is an object of the present invention to provide a method for doping a silicon wafer using a solid phosphorus dopant source in which the doped wafer is oxidized while in close proximity to the solid source in situ while maintaining the useful life of the source.

It is a further object of the present invention to provide a method for obtaining a satisfactory oxide thickness layer on a phosphorus-doped silicon wafer at a lower temperature than conventional oxidation methods without excessively long oxidation times, and particularly a method for obtaining an oxide layer of any desired thickness by selection of the appropriate wet oxidation time at the lower temperature.

It is another object of the invention to provide a method for oxidizing a phosphorus-doped silicon wafer that maintains the diffusion of phosphorus into the silicon at a depth comparable to that observed when using doping methods such as $POCl_3$ or $PH_3$ that use conventional wet oxidation methods at elevated temperatures.

It is yet another object of the invention to provide a method for doping and oxidizing a silicon wafer that reduces handling of the silicon wafers and exposure of the silicon wafers to humid room air compared to conventional wet oxidation methods using solid dopant sources.

These and other objects of the present invention will be apparent from the specification that follows, the appended claims, and the drawings.

SUMMARY OF THE INVENTION

The present invention overcomes the problems associated with conventional solid source doping methods. It allows doping of silicon wafers with a solid phosphorus dopant source followed by a steam oxidation of the doped silicon wafers without first removing the wafers from the diffusion furnace and without drastically decreasing the life of the solid dopant sources.

The method of the present invention involves placing a silicon wafer in spaced relationship to a solid phosphorus dopant source at a first temperature for a time sufficient to deposit a phosphorus-containing layer on the surface of the wafer, oxidizing the doped silicon wafer by a wet oxidation method at a second temperature lower than the first temperature, and maintaining the silicon wafer in spaced relationship with the solid phosphorus dopant source during the oxidizing step. The first and second temperatures are selected such that the solid phosphorus dopant source evolves $P_2O_5$ at the first temperature and the second temperature is sufficiently lower than the first temperature to decrease evolution of $P_2O_5$ from the solid phosphorus dopant source during the oxidizing step. The second temperature may be selected to be less than or equal to about 900° C. and particularly in the range of about 600 to 900° C.

In the present method, the step of maintaining the silicon wafer in spaced relationship to the solid phosphorus dopant source may include placing the silicon wafer in close proximity and substantially parallel to the solid phosphorus dopant source, with the silicon wafer being maintained in this position during the oxidizing step. The temperatures are selected such that the solid phosphorus dopant source evolves $P_2O_5$ at the first temperature and the second temperature is sufficiently lower than the first temperature to decrease evolution of $P_2O_5$ from the solid phosphorus dopant source during the oxidizing step. The second temperature may be selected to be in the range of about 600 to 900° C.

The method further may include the step of selecting a wet oxidation method from oxidization with wet oxygen and oxidation with pyrogenic steam, in which oxidation with wet oxygen includes oxidation with oxygen bubbled through deionized water. The method also may include the step of selecting a solid dopant source that decomposes at high temperatures, the solid dopant source being selected from an aluminum metaphosphate ($Al(PO_3)_3$) dopant source, a rare earth metaphosphate ($Ln(PO_3)_3$, where "Ln" refers to a rare earth element) dopant source, and a rare earth pentaphosphate ($LnP_5O_{14}$) dopant source.

The method of the invention may include the step of maintaining a silicon wafer and a phosphorus solid dopant source for vapor phase deposition of $P_2O_5$ in vapor phase communication at a temperature and for a time sufficient to form a layer of n-type conductivity on the surface of the silicon wafer and subsequently oxidizing the doped silicon wafer with an oxidizing agent selected from wet oxygen and pyrogenic steam at a second temperature for a time sufficient to form on the surface of the silicon wafer an oxide layer having a predetermined thickness, with the second temperature being sufficiently lower than the first temperature to decrease the evolution rate of $P_2O_5$ from the solid dopant source while the silicon wafer is maintained in vapor phase communication with the solid dopant source during the oxidation step. The second temperature may be selected to be in the range of about 600 to 900° C. For example, the oxidation step may be carried out at about 775° C. for about 3 hours to form on the surface of the silicon wafer an oxide layer having a thickness of about 4000 Å. The method may include the step of selecting a solid dopant source from an aluminum metaphosphate dopant source, a rare earth metaphosphate dopant source, and a rare earth pentaphosphate dopant source.

The invention also provides a method of doping a silicon wafer including the steps of maintaining a silicon wafer and a solid phosphorus dopant source in close proximity for vapor phase deposition of $P_2O_5$ at a temperature and for a time sufficient to form a layer of n-type conductivity on the surface of the silicon wafer, oxidizing the doped silicon wafer with an oxidizing agent selected from wet oxygen and pyrogenic steam at a second temperature lower than the first temperature, and maintaining the silicon wafer in close proximity to the solid phosphorus dopant source during the oxidizing step. The second temperature, which is selected to be sufficiently lower than the first temperature to substantially decrease the evolution of $P_2O_5$ from the solid dopant source during the oxidizing step, may be in the range of about 600 to 900° C.

The oxidizing step may be carried out at the second temperature for a time sufficient to form on the surface of the silicon wafer an oxide layer of a predetermined thickness, such as a thickness of about 4000 Å. The method also may include the step of selecting a solid dopant source that decomposes at a high temperature, the dopant source being selected from an aluminum metaphosphate dopant source, a rare earth metaphosphate dopant source, and a rare earth pentaphosphate dopant source.

The method of doping a silicon wafer may include the steps of placing a silicon wafer in spaced relationship to a solid phosphorus dopant source at a first temperature for a time sufficient to deposit a phosphorus-containing layer on the surface of the wafer, oxidizing the doped silicon wafer by a wet oxidation method at a second temperature lower than the first temperature, and maintaining the silicon wafer in spaced relationship to the solid phosphorus dopant source during the oxidizing step. The temperatures are selected such that the solid phosphorus dopant source evolves $P_2O_5$ at the first temperature and the second temperature is sufficiently lower than the first temperature to decrease evolution of $P_2O_5$ from the solid phosphorus dopant source during the oxidizing step. The second temperature may be selected to be less than or equal to about 900° C. and particularly in the range of about 600 to 900° C.

The above-described method may include one or more of the steps of maintaining the silicon wafer in close proximity and substantially parallel to the solid phosphorus dopant source during the oxidizing step and selecting a wet oxidation method from oxidation with wet oxygen and oxidation with pyrogenic steam. The temperatures are selected such that the solid phosphorus dopant source evolves $P_2O_5$ at the first temperature and the second temperature is sufficiently lower than the first temperature to decrease evolution of $P_2O_5$ from the solid phosphorus dopant source during the oxidizing step. The second temperature may be selected to be in the range of about 600 to 900° C. The method further may include the step of selecting a solid dopant source from an aluminum metaphosphate dopant source, a rare earth metaphosphate dopant source, and a rare earth pentaphosphate dopant source.

The invention further provides a method of growing an oxide layer on a silicon wafer, including the step of wet oxidizing a doped silicon wafer at a temperature sufficient to substantially decrease the $P_2O_5$ evolution rate of a solid phosphorus dopant source maintained in vapor phase communication with the silicon wafer during the wet oxidizing step. The wet oxidizing temperature may be selected to be less than or equal to about 900° C. and particularly in the range of about 600 to 900° C. The wet oxidizing step may involve exposing the doped silicon wafer to an oxidizing agent selected from wet oxygen and pyrogenic steam.

The method may include the step of selecting a temperature and time for the wet oxidizing step sufficient to form on the surface of the doped silicon wafer an oxide layer having a predetermined thickness. The wet oxidizing temperature may be selected to be in the range of about 600 to 900° C. For example, the wet oxidizing step may be carried out at about 775° C. for about 3 hours. The method also may include the step of forming a doped silicon wafer by heating a silicon wafer in vapor phase communication with a solid dopant source. The solid dopant source may be selected from an aluminum metaphosphate dopant source, a rare earth metaphosphate dopant source, and a rare earth pentaphosphate dopant source These and further objects of the invention will become apparent from the following detailed description.

DETAILED DESCRIPTION OF THE PREFERRED EMBODIMENT(S)

The present invention provides a method of doping silicon wafers involving a subsequent wet oxidation or pyrogenic steam oxidation of the silicon wafers in situ. The method allows the silicon wafers to remain in close proximity (e.g., in vapor phase communication with the solid dopant sources within the diffusion tube) during the oxidizing step without quickly depleting the useful life of the solid phosphorus dopant source.

The method requires that the doping and oxidizing steps be carried out under different processing conditions. The doping step is carried out at a high temperature, i.e., about 1050° C. in dry nitrogen with possibly a small amount of oxygen. The steam or wet oxidation is carried out at a lower temperature, i.e., about 775° C. Under these conditions, the $P_2O_5$ evolution rate from the solid dopant source is reduced significantly compared to the evolution rate expected in wet oxidation or pyrogenic steam oxidation at the higher doping temperature. Careful selection of the oxidation temperature results in a $P_2O_5$ evolution rate at the low temperature that approaches the $P_2O_5$ evolution rate at the higher doping temperature in nitrogen. The silicon wafer therefore may be oxidized by the wet oxygen or pyrogenic steam, in the presence of the solid dopant source, without rapid depletion the phosphorus in the solid dopant source. The present method also reduces processing time and operator handling by eliminating the steps of ramping the furnace down to the insertion temperature, removing the doped silicon wafers from the diffusion boat, and ramping the temperature back up to the oxidation temperature.

In the method of the present invention, silicon wafers typically are placed adjacent and substantially parallel to a solid phosphorus dopant source in a diffusion boat. Diffusion boats of various designs may be used, although a four-rail quartz boat with standard paddles and cantilever systems, compatible with automatic transfer systems, generally is preferred. The spacing between the silicon surface and the source surface preferably is constant and in the range of about 0.06–0.10 inch. The slots for the sources preferably are about 0.01 inch wider than their thickness. The sources should fit loosely in the boat with room for expansion of at least 0.01 per inch of diameter.

The solid dopant source may be selected from dopant sources made from an aluminum metaphosphate, a rare earth metaphosphate, a rare earth pentaphosphate (including $LaZrP_3$), or another suitable dopant composition. Although superior results are obtained when at least three dopant sources are used per boat, typical semiconductor production may use 50 to 100 or more sources.

Preferably, a conventional furnace ramping technique is used for the doping or deposition cycle. This involves slowly inserting the boat containing the wafers and dopant sources into the diffusion tube at a temperature below about 800° C. and at least 100° C. less than the deposition temperature. Preferably, the insertion rate is not more than 4 inches per minute for 100 mm diameter sources. Slower insertion rates are preferred for larger diameter sources due to the greater mass of material involved.

After the furnace and boat have reached thermal equilibrium the furnace is ramped up to the deposition temperature. The deposition temperature preferably is in the range of about 950–1150° C., most preferably about 1025° C., although this may vary with the application. The deposition step typically is carried out under nitrogen and/or argon, although small amounts of oxygen may be used at deposition temperatures greater than about 1000° C. The preferred oxygen concentration is less than about 1%, although up to about 5% oxygen may be used at deposition temperatures above about 1100° C.

The gas flow rate during deposition depends primarily upon the diffusion equipment, such as tube size and end cap design. The flow rate must at least be high enough to prevent room air from backstreaming down the diffusion tube. Flow rates ranging from about 2 liters/minute to about 15 liters/minute have been used successfully in a 135 mm diameter diffusion tube, with a flow rate of about 3–7 liters/minutes being preferred.

The doping step is carried out at the deposition temperature for a time sufficient to deposit a phosphorus-containing layer on the wafer surface that will diffuse to a desired depth within the wafer within a reasonable time. The deposition time may vary with the deposition temperature and other factors well known in the art. For example, the deposition time for doping a silicon wafer with an aluminum metaphosphate solid dopant source at about 1050° C. may be about 30–60 minutes to obtain a sheet resistivity of about 4–5 ohms/sq.

The furnace temperature gradually is reduced to cool the silicon wafers and sources in preparation for the steam oxidation and the oxidizing agent is introduced into the furnace. The oxidizing agent may be selected from pyrogenic steam (i.e., steam resulting from the combustion of hydrogen with oxygen) and wet oxygen (e.g., oxygen bubbled through deionized water maintained at about 95° C.). The oxidation of the doped silicon wafer with wet oxygen or pyrogenic steam is referred to as "wet oxidation." "Wet oxygen" includes oxygen bubbled through deionized water maintained at a suitable temperature, e.g., about 95° C., or prepared by any other suitable method.

The doped silicon wafer is oxidized at a second temperature lower than the deposition temperature. The wet oxidation temperature should be high enough to keep the oxidation time as short as possible and low enough to keep $P_2O_5$ from evolving from the phosphorus source at too high of a rate. The more rapidly the $P_2O_5$ evolves from the source in steam, the more rapidly the source becomes depleted. The solid phosphorus dopant source may remain in the diffusion tube in close proximity to the silicon wafer during the oxidation step because the second temperature is sufficiently lower than the first temperature to decrease the $P_2O_5$ evolution rate to an acceptable level.

Silicon wafers doped with a PhosPlus® TP-470 dopant source at 1050° C. for 45 minutes may be oxidized in wet oxygen at 775° C. for about 1–3 hours at a flow rate of at least about 1 liter/min. It is believed that somewhat higher flow rates will result in more uniform oxidation of the silicon wafers from top to bottom. When the oxidation is completed, the flow of oxidizing agent into the furnace is discontinued, the furnace temperature gradually is reduced to a temperature in the range of the insertion temperature, and the boat is slowly pulled from the furnace. The oxidation may be carried out at a temperature and for a time sufficient to form on the surface of the silicon wafer an oxide layer having a desired thickness, such as 2000 Å or 4000 Å.

The lower oxidation temperature of the present method also means that the additional diffusion of phosphorus into the silicon is very small compared to the diffusion at or near the high doping temperature of conventional (dry oxygen) oxidation methods at elevated temperatures. Handling is reduced with the present method compared to conventional wet oxidation methods because the wet oxidation is accomplished in situ. The present method also eliminates the effect of humidity of room air between doping and oxidation.

Silicon wafers doped and oxidized using the present method have been found to have sheet resistivities in the range of about 5–7 ohms/sq. and glass film (oxide) thicknesses in the range of about 4000–5000 Å. For example, silicon wafers doped with PhosPlus® TP-470 dopant sources at 1050° C. for 45 minutes and oxidized in wet oxygen (bubbled through 95° C. deionized water) at 775° C. for about 3 hours had a sheet resistivity of about 5.7 ohms/sq. and an oxide thickness of about 4000 Å. The solid dopant sources continued to evolve $P_2O_5$ normally at about 1050° C. after the wet oxidation at 775° C. Testing was repeated several times with similar results. Thus, the method of the invention is capable of producing acceptable glass film thicknesses and sheet resistivities without removing the solid dopant sources from the diffusion tube during the wet oxidation step and without drastically reducing the useful lifetime of the solid dopant sources.

EXAMPLE

Silicon wafers (100 mm diameter, 5–20 ohms and 111-p-type boron) were doped with PhosPlus® TP-470 100 mm diameter planar dopant sources containing a high percentage of aluminum metaphosphate and oxidized using the following cycle:

Insert boat into the diffusion tube at 3.0 inches/minute at 700° C.

Ramp 5° C./minute to 1050° C. and hold 30 minutes in flowing $N_2$

Ramp 5° C./minute to wet oxidation temperature, X

Hold at wet oxidation temperature for time, Y

Ramp 5° C./min to 700° C.

Pull boat from the diffusion tube at 3.0 inches/minute.

Wet oxidation temperatures (X) of 700° C., 750° C., 775° C., 800° C. and 1000° C. and wet oxidation times (Y) ranging from 1 to 3 hours were evaluated. For the wet oxidation step, oxygen was bubbled through deionized water maintained at 95° C. A new set of sources was used for each oxidation temperature. Each set of sources was aged prior to use for approximately 12 hours in $N_2$ with about 25% $O_2$.

Weight loss measurements of the sources were made using an analog balance. The deposited glassy film thicknesses were measured using a Gaertner ellipsometer. Sheet resistivity measurements were made on wafers previously etched in a 10:1 HF using a standard four-point probe.

Figure 4:
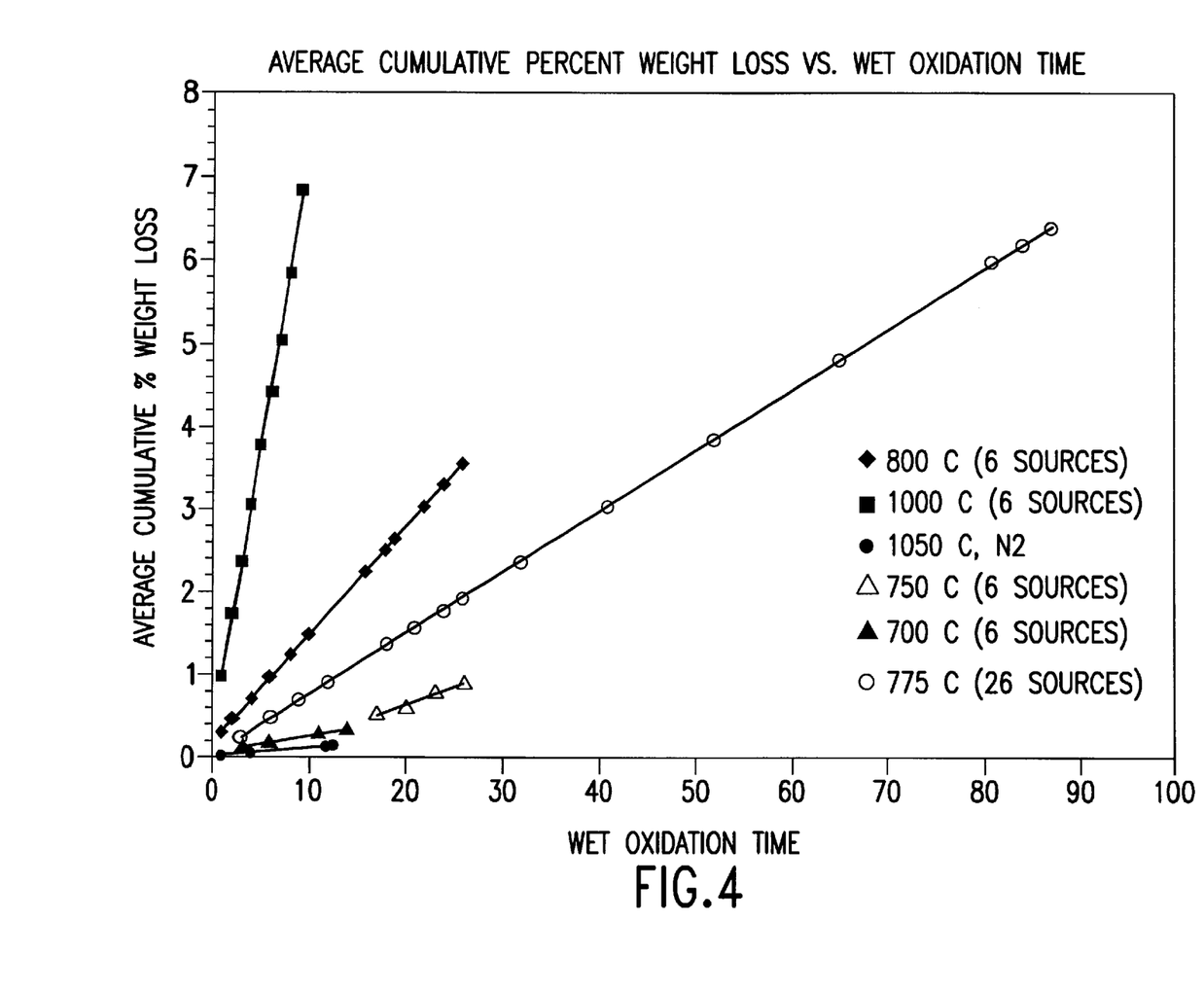
FIG. 4 is a graph showing the average cumulative percent weight loss vs. time of a PhosPlus® TP-470 dopant source exposed to steam at various temperatures.
Figure 5:
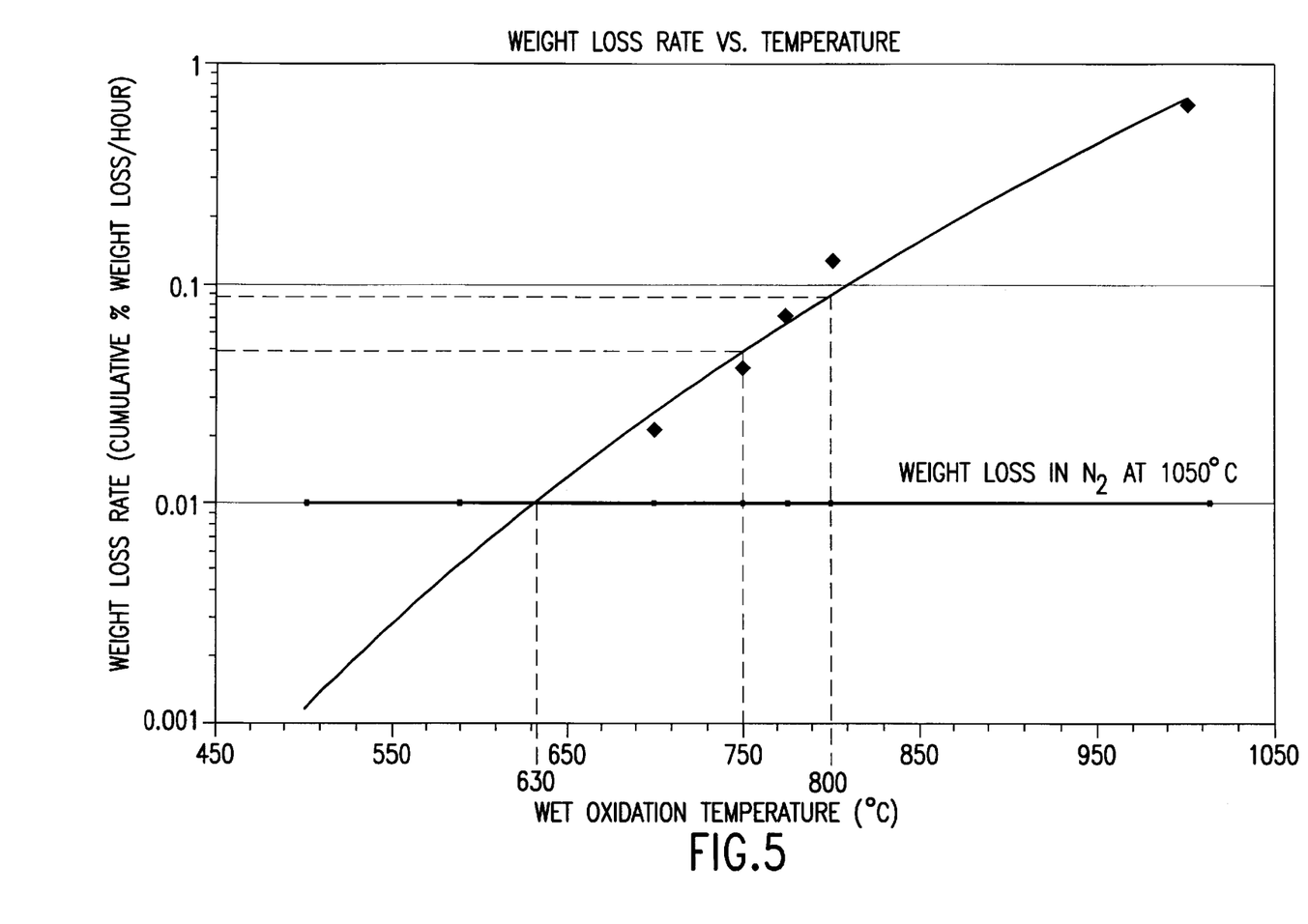
FIG. 5 is a graph showing the weight loss rate of $P_2O_5$ from a PhosPlus® TP-470 dopant source in wet oxygen vs. temperature.

Sources were held at each wet oxidation temperature in wet oxygen for the specified time to evaluate the rate of $P_2O_5$ depletion from the solid source by measuring the weight loss of the solid sources. The weight loss measurements showed that phosphorus is lost at a rate of less than 0.01 o%/hour in nitrogen at 1050° C. (see FIG. 4). When the gas is changed to wet oxygen, the rate increases to more than 0.7 %/hour at 1000° C. The evolution rate in wet oxygen decreases significantly as the wet oxidation temperature decreases from 1000° C. and approaches the rate in dry nitrogen as the oxidation temperature approaches about 630° C. (see FIG. 5).

Figure 1:
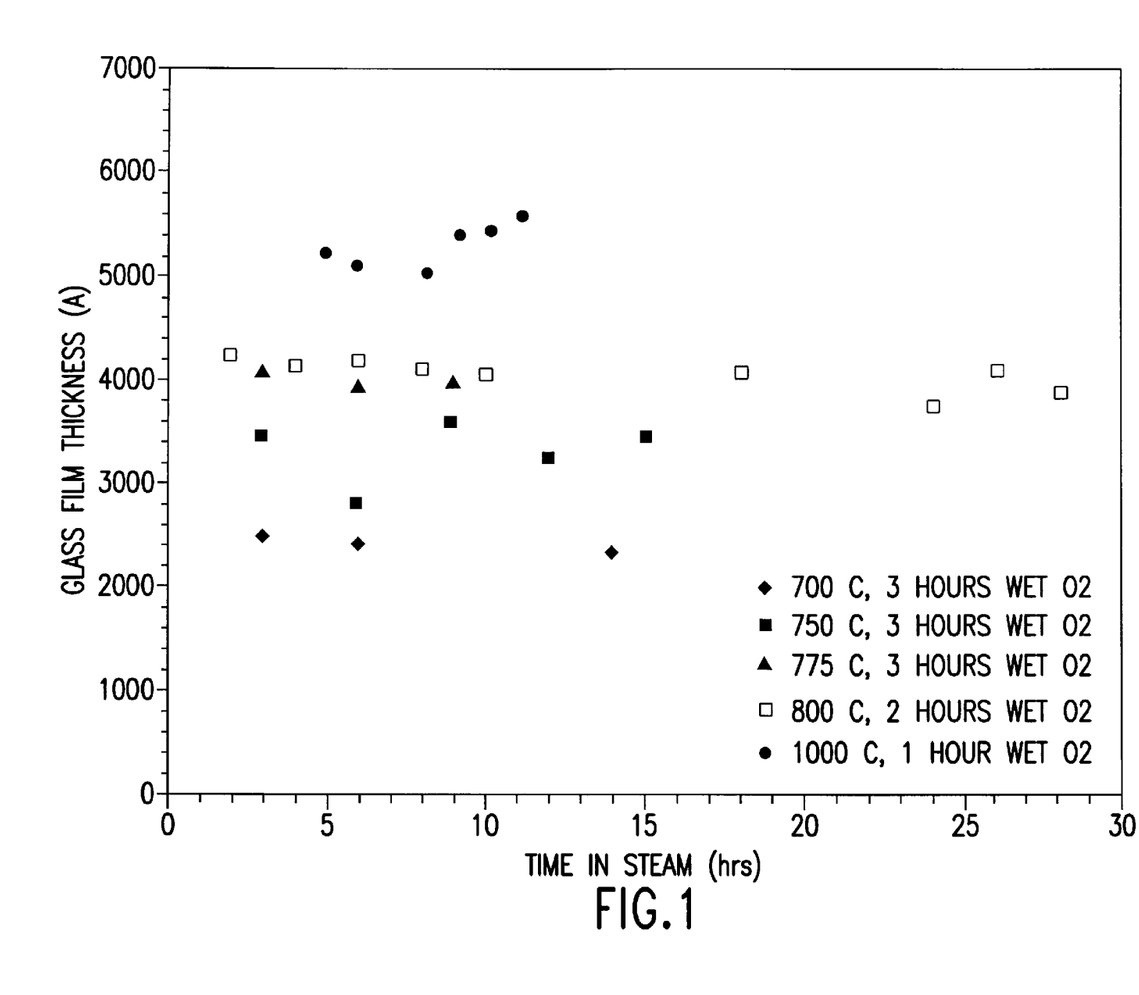
FIG. 1 is a graph showing glass film thickness vs. time in steam for selected wet oxidation temperatures.

Glass film thicknesses vs. time in wet oxygen after doping at 1050° C. for 30 minutes are shown in FIG. 1 for each wet oxidation temperature. The deposited glass film thickness was found to increase with oxidation time in wet oxygen for a fixed temperature as well as for increased temperature for a fixed time. The method of the present invention therefore allows for formation of an oxide layer of any desired thickness on the surface of the silicon wafer by selecting the appropriate wet oxidation temperature and time.

In this case, a desired glass film thickness of about 4000 Å was approached using a deposition of 1050° C. in nitrogen for about 30 minutes followed by wet oxidation for about 2 hours at 800° C. The uniformity decreased rapidly with increased source time in steam at 800° C. As a result, a lower oxidation temperature of about 775° C. generally is preferred.

Figure 2:
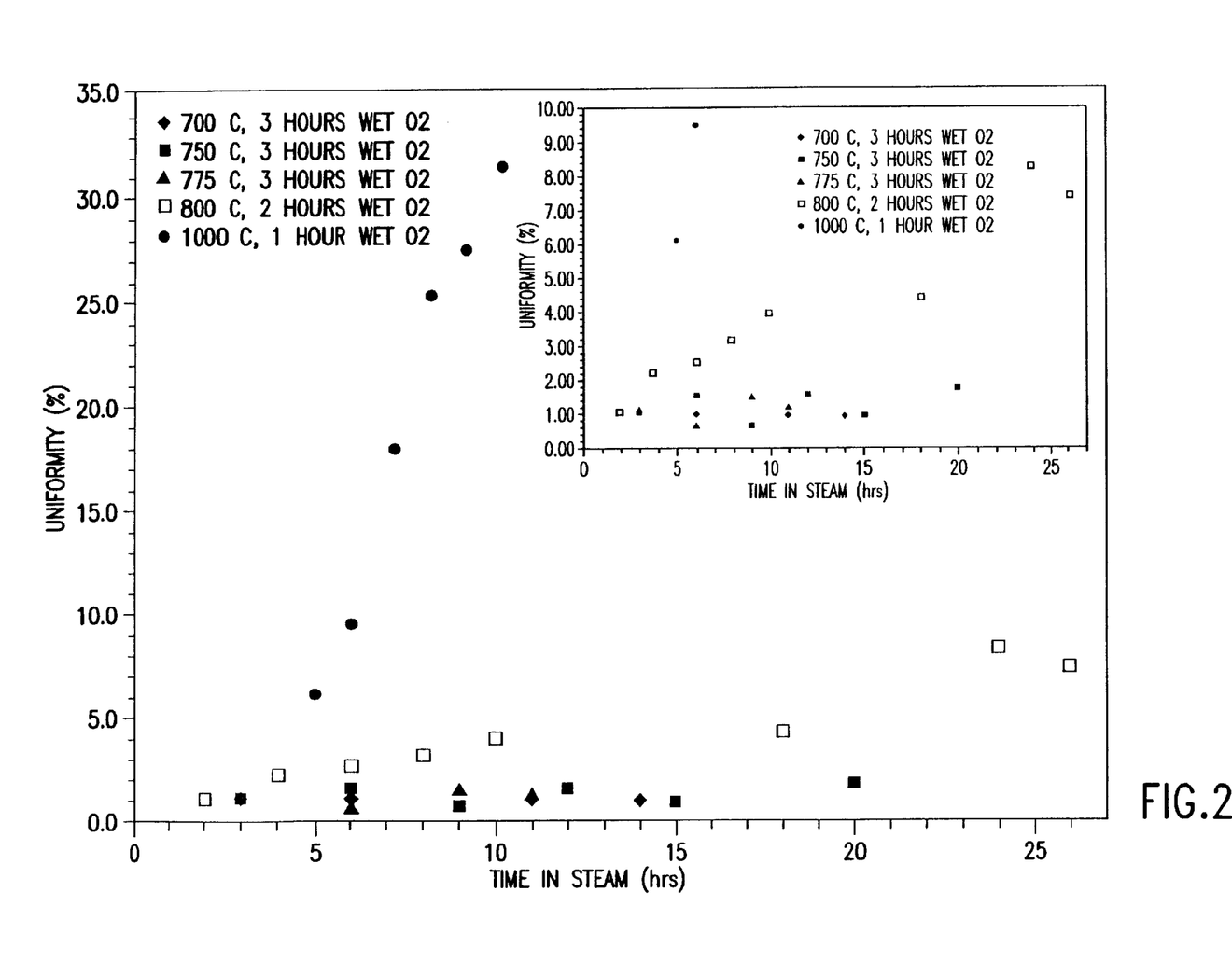
FIG. 2 is a graph showing the uniformity of the glass film thickness on a silicon wafer vs. time in steam at various wet oxidation temperatures.

In an effort to increase the sheet resistivity uniformity, the wet oxidation temperature was decreased from 800° C. to 775° C. and the oxidation time was increased from about 2 hours to about 3 hours. As shown in FIG. 1, these changes resulted in a desired glass film thickness of about 4000 Å. The sheet resistivity uniformity improved substantially, as shown in FIG. 2. Even after 11 hours in steam at 775° C., the resulting uniformity of the doped silicon wafers falls within a 2% range (see enlarged graph portion in upper right hand corner). This was true of all other wet oxidations performed at temperatures below 775° C.

Figure 3:
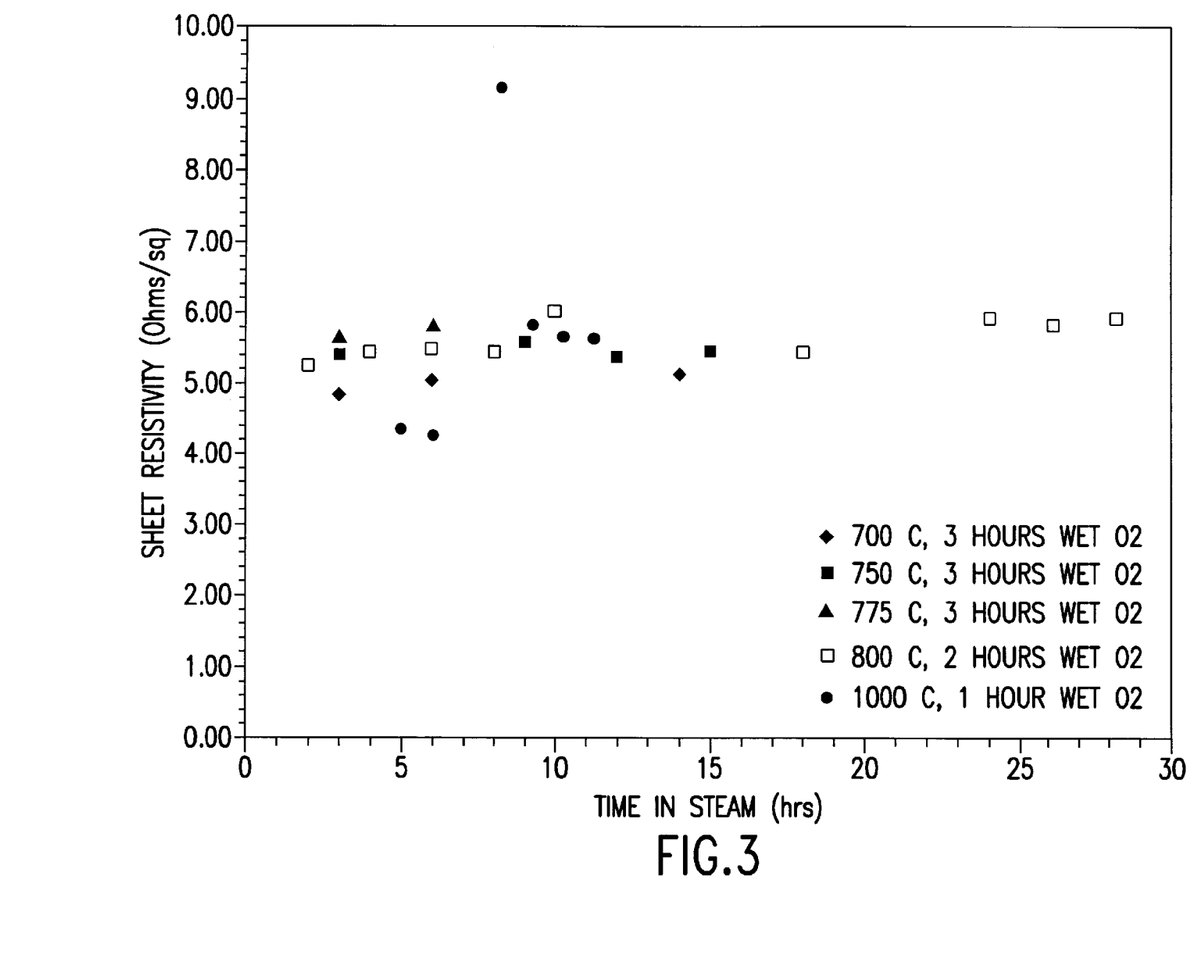
FIG. 3 is a graph showing sheet resistivities vs. time in steam for selected wet oxidation temperatures.

In FIG. 3, the sheet resistivities vs. time in steam have been plotted for each of the wet oxidation temperatures. The wet oxidation at 775° C. gave average sheet resistivity values between 5 and 6 ohms/sq., which is within the range preferred for some emitter diffusions.

Wet oxidation times of about 5 hours at 775° C. have been found to result in glass films with a thickness in excess of about 5100 Å. However, the thicker glass film is achieved at the expense of sheet resistivity (in the range of about 6.3 ohms/sq.). The higher sheet resistivity is believed to result from oxidation of more of the phosphorus-containing silicon, thus reducing the amount of active phosphorus present above the p/n junction. It is believed that an increase in the deposition hold time at about 1050° C. followed by wet oxidation at about 775° C. under the conditions described above may allow for the formation of the thick oxide layer while still maintaining acceptable uniformity.

Recent tests suggest that solid dopant sources other than PhosPlus® TP-470 dopant sources containing a high percentage of aluminum metaphosphate also may be used effectively in the method of the present invention. As described below, rare earth metaphosphate sources may be used with the method of the present invention. A lanthanum metaphosphate ($La(PO_3)_3$) dopant source was prepared by firing three 100 mm PhosPlus® TP-250 (predominantly lanthanum pentaphosphate, $LaP_5O_{14}$) dopant sources at 975° C. for about 16 hours and then at about 1050° C. for an additional two hours. The high temperatures caused the pentaphosphate to convert to the metaphosphate. Similar firings were made with 2-inch diameter neodymium pentaphosphate ($NdP_5O_{14}$) and gadolinium pentaphosphate ($GdP_5O_{14}$) sources to convert them to the corresponding metaphosphates ($Nd(PO_3)_3$ and $Gd(PO_3)_3$). Tests also were conducted using 2-inch diameter erbium metaphosphate ($Er(PO_3)_3$) and praseodymium metaphosphate ($Pr(PO_3)_3$) sources, believed to be in the metaphosphate form based on weight loss data obtained during the initial firing.

The above-identified rare earth metaphosphate sources were weighed before and after aging in $N_2$ at about 1050° C. (1100° C. for the $Er(PO_3)_3$ source) to obtain a weight loss rate. They were then weighed before and after aging in wet oxygen (oxygen bubbled through 95° C. deionized water) to obtain another weight loss rate. Weight loss ratios (grams/hr/in$^2$ of surface area) in wet oxygen at 775° C. to nitrogen at 1050° C. (1100° C. for the Er source) were calculated to determine the effect of wet oxygen on the $P_2O_5$ evolution rate. The results of these tests are shown in Table 1.

TABLE 1

|  | La | Nd | Gd | Er* | Pr |
|---|---|---|---|---|---|
| Weight loss in $N_2$ at 1050° C., $\times 10^{-2}$ g/hr/in$^2$ | 0.044 | 0.016 0.021 | 0.024 0.015 | 0.016* | 0.075 |
| Weight loss in wet $O_2$ at 775° C., $\times 10^{-2}$ g/hr/in$^2$ | 0.21 | 0.297 | 0.55 | 0.253* | 1.04 |
| Ratio, wet $O_2/N_2$ | 5 | 15 | 28 | 15* | 14 |

*Aging in $N_2$ at 1100° C. rather than 1050° C.

The weight loss ratios ranged from 5 to 28, with the dopant sources having the lower ratios being more likely to perform satisfactorily when used in the present method. Based on these limited tests, the Er, Nd, Pr and Gd metaphosphate sources were less resistant to wet oxygen than the aluminum metaphosphate source (weight loss ratio about 5.0) and the lanthanum metaphosphate source had about the same resistance to wet oxygen.

Each source was used to dope silicon wafers at 1050° C. for 45 minutes in $N_2$ to obtain sheet resistivities and deposited glass film thickness. The sources were then used to dope silicon at 1050° C. for 45 minutes followed by 775° C. for 3 hours in wet oxygen to obtain sheet resistivities and the film thickness of the oxidized silicon surface. Finally, the sources were used to dope silicon one more time in nitrogen at 1050° C. for 45 minutes to see how the deposited film thickness had changed as a result of exposure of the sources to wet oxygen. The results of these tests are shown in Table 2.

TABLE 2

|  | La | Nd | Gd | Er | Pr |
|---|---|---|---|---|---|
| $R_s$, ohms/sq. (doping test, in $N_2$ at 1050 C. for 45 min., before $H_2O$) | 3.1 | 4.1 | 6.2 | 5.0 | 4.8 |
| t, Å (doping test, in $N_2$ at 1050 C. for 45 min., before $H_2O$) | ~600 | 740 | 470 | 550 | 590 |
| $R_s$, ohms/sq. (doping test, in $N_2$ at 1050 C. for 45 min., after $H_2O$) | 6.9 | 4.8 | 5.1 | 5.8 | 5.4 |
| t, Å (doping test, in $N_2$ at 1050 C. for 45 min., after $H_2O$) | 470 | 600 | 570 | 480 | 550 |
| $R_s$, ohms/sq. (doping test, in $N_2$ at 1050 C. for | 4.7 | 5.2 6.1 | 7.0 | 6.9 | 6.1 |

TABLE 2-continued

| | La | Nd | Gd | Er | Pr |
|---|---|---|---|---|---|
| 45 min. followed by wet O$_2$ at 775 C. for 3 hrs) t, Å (doping test, in N$_2$ at 1050 C. for 45 min. followed by wet O$_2$ at at 775 C. for 3 hrs. | 4190 | 3850 3990 | 3820 | 3895 | 4025 |

As shown in Table 2, the deposited glass film thickness when doping in N$_2$ for all sources averaged about 590 Å. The average film thickness when doping in N$_2$ after the sources had been used in wet oxygen was about 530 Å. The 60 Å decrease in film thickness is regarded as small and shows that the dopant sources continued to dope silicon effectively even after holding them in wet oxygen for 3–6 hours.

The sheet resistivities measured were in the range of about 5–6 ohms/sq. These sheet resistivities were in the range expected for deposition at 1050° C. for 45 minutes with a single source. (When only a single source is used to dope the silicon, the sheet resistivity usually is higher than if three or more sources are used,)

The silicon wafers all grew about the same amount of glass during the 1050° C. deposition for 45 minutes followed by 3 hours in wet oxygen at 775° C. The film thickness averaged 3960 Å. The sheet resistivities of the doped and oxidized silicon wafers were about 6 ohms/sq., which again was within the range expected for use of a single dopant source. These experimental data indicate that doping rare earth metaphosphate sources in dry nitrogen and oxidizing at a low temperature in wet oxygen for the rare earth metaphosphate sources produces results similar to those obtained from the aluminum metaphosphate source.

The invention also provides a method of rapidly oxidizing the silicon wafer. Typically, the oxide thickness on an undoped silicon wafer after about 3 hours in steam at 775° C. would be less than 1000 Å. When the oxidation is carried out in wet oxygen or in pyrogenic steam at 775° C. after doping at about 1050° C., the oxide thickness may be increased to about 4000 Å for the same oxidation time. Because the silicon surface is heavily doped with phosphorus (active and inactive), the oxidation rate is very high at low temperatures, thus shortening the required oxidation time compared to the oxidation of undoped silicon. This high oxidation rate also might occur with gas doping, but published literature, such as S. Wolf and R. Tauber, *Silicon Processing for the VLSI Era* (Lattice Press 1986), Vol. 1, p. 214, does not seem to indicate as high of an enhanced oxidation rate as the silicon that has been doped with solid sources.

While not wishing to be bound by theory, this significant increase in oxidation rate at 775° C. may be partially attributable to the enhanced oxidation rate of the phosphorus-doped silicon surface. The rapid increase in oxidation rate may also be partially related to electrically inactive phosphorus often present in the surface of silicon wafers that have been doped at the higher temperature deposition cycle.

The present invention has been described with reference to a method that yields particular results when carried out under defined conditions. Other deposition temperatures, oxidation temperatures, and other reaction conditions are expected to produce a range of sheet resistivities and oxide thicknesses.

Throughout this specification, when a range of conditions or a group of substances is defined with respect to a particular characteristic (e.g., temperature, pressure, time and the like) of the present invention, the present invention relates to and explicitly incorporates every specific member and combination of subranges or subgroups therein. Any specified range or group is to be understood as a shorthand way of referring to every member of a range or group individually as well as every possible subrange and subgroup encompassed therein; and similarly with respect to any subranges or subgroups therein.

Although a specific embodiment of the invention has been described in detail, it is understood that variations may be made thereto by those skilled in the art without departing from the spirit of the invention or the scope of the appended claims.

What is claimed is:

1. A method of doping a silicon wafer, comprising the steps of:

depositing a phosphorus-containing layer on the surface of a silicon wafer by heating a solid phosphorus dopant source at a first temperature in the presence of the silicon wafer;

oxidizing the phosphorus-containing layer on the surface of the silicon wafer by a wet oxidation method at a second temperature lower than the first temperature; and maintaining the silicon wafer at a constant distance from the solid phosphorus dopant source during the depositing and oxidizing steps.

2. The method of claim 1, further comprising the steps of:

selecting the first temperature sufficient to cause the solid phosphorus dopant source to evolve P$_2$O$_5$; and selecting the second temperature sufficient to cause the rate of evolution of P$_2$O$_5$ from the solid phosphorus dopant source during the oxidizing step to decrease relative to the rate of evolution of P$_2$O$_5$ from said source during wet oxidation at the first temperature.

3. The method of claim 2, wherein the step of selecting the second temperature further comprises the step of selecting a temperature sufficient to cause the rate of evolution of P$_2$O$_5$ from the solid phosphorus dopant source to approach the rate of evolution of P$_2$O$_5$ from said source in dry nitrogen at the first temperature.

4. The method of claim 2, wherein the step of selecting the second temperature further comprises the step of selecting a temperature less than or equal to about 900° C.

5. The method of claim 2, wherein the step of selecting the second temperature further comprises the step of selecting a temperature in the range of about 600 to 900° C.

6. The method of claim 1, further comprising the step of:

selecting the second temperature in the range of about 600 to 900° C.

7. The method of claim 1, wherein the step of maintaining the silicon wafer at a constant distance from the solid phosphorus dopant source further comprises the step of placing the silicon wafer adjacent to the solid phosphorus dopant source in a diffusion boat.

8. The method of claim 1, wherein the step of maintaining the silicon wafer at a constant distance from the solid phosphorus dopant source further comprises the step of spacing the silicon wafer at a distance of 0.06–0.10 inch from the solid phosphorus dopant source.

9. The method of claim 1, further comprising the step of:

selecting a wet oxidation method from oxidization with wet oxygen and oxidation with pyrogenic steam.

10. The method of claim 9, wherein oxidation with wet oxygen comprises oxidation with oxygen bubbled through deionized water.

11. The method of claim 1, further comprising the step of:

selecting the solid phosphorus dopant source from an aluminum metaphosphate dopant source, a rare earth metaphosphate dopant source, and a rare earth pentaphosphate dopant source.

12. A method of doping a silicon wafer, comprising the steps of:

forming a layer of n-type conductivity on a surface of a silicon wafer by vapor phase deposition of $P_2O_5$ from a solid phosphorus dopant source at a temperature and for a time sufficient to form a layer of a desired thickness; and oxidizing the layer of n-type conductivity in the presence of the solid phosphorus dopant source, the oxidizing step being accomplished with an oxidizing agent selected from wet oxygen and pyrogenic steam at a second temperature lower than the first temperature.

13. The method of claim 12, further comprising the steps of:

selecting the first temperature sufficient to cause the solid phosphorus dopant source to evolve $P_2O_5$; and selecting the second temperature sufficient to cause the rate of evolution of $P_2O_5$ from the solid phosphorus dopant source during the oxidizing step to decrease relative to the rate of evolution of $P_2O_5$ from said source during wet oxidation at the first temperature.

14. The method of claim 12, wherein the step of selecting the second temperature further comprises the step of selecting a temperature sufficient to cause the rate of evolution of $P_2O_5$ from the solid phosphorus dopant source to approach the rate of evolution of $P_2O_5$ from said source in dry nitrogen at the first temperature.

15. The method of claim 13, wherein the step of selecting the second temperature further comprises the step of selecting a temperature less than or equal to about 900° C.

16. The method of claim 15, wherein the step of selecting the second temperature further comprises the step of selecting a temperature in the range of about 600 to 900° C.

17. The method of claim 12, further comprising the step of:

maintaining the silicon wafer at a constant distance from the solid phosphorus dopant source during the layer forming and oxidizing steps.

18. The method of claim 17, wherein the step of maintaining the silicon wafer at a constant distance from the solid phosphorus dopant source further comprises the step of placing the silicon wafer adjacent to the solid phosphorus dopant source in a diffusion boat.

19. The method of claim 17, wherein the step of maintaining the silicon wafer at a constant distance from the solid phosphorus dopant source further comprises the step of spacing the silicon wafer at a distance of 0.06–0.10 inch from the solid phosphorus dopant source.

20. The method of claim 12, further comprising the step of:

selecting a solid phosphorus dopant source from an aluminum metaphosphate dopant source, a rare earth metaphosphate dopant source, and a rare earth pentaphosphate dopant source.

21. The method of claim 12, wherein the oxidizing step further comprises the step of selecting a time for the oxidizing step sufficient to form on the surface of the silicon wafer an oxide layer of a predetermined thickness.

22. The method of claim 21, wherein the oxidizing step further comprises selecting a second temperature and a time for the oxidizing step sufficient to form on the surface of the silicon wafer an oxide layer having a thickness of about 4000 Å.

23. A method of growing an oxide layer on a silicon wafer, comprising the step of:

wet oxidizing a doped silicon wafer in the presence of a solid phosphorus dopant source at a temperature less than or equal to about 900° C.

24. The method of claim 23, wherein the wet oxidizing step further comprises the step of exposing the doped silicon wafer to an oxidizing agent elected from wet oxygen and pyrogenic steam.

25. The method of claim 23, further comprising the step of:

selecting a temperature for the wet oxidizing step in the range of about 600 to 900° C.

26. The method of claim 23, further comprising the step of:

selecting a temperature and time for the wet oxidizing step sufficient to form on the surface of the doped silicon wafer an oxide layer having a predetermined thickness.

27. The method of claim 26, wherein the step of selecting a temperature and time for the wet oxidizing step further comprises the step of selecting a temperature of about 775° C. and a time of about 3 hours.

28. The method of claim 23, further comprising the step of:

forming a doped silicon wafer by heating a silicon wafer in the presence of the solid phosphorus dopant source at a temperature sufficient to evolve $P_2O_5$ from the solid phosphorus dopant source.

29. The method of claim 23, further comprising the step of:

forming a doped silicon wafer by heating a silicon wafer in the presence of the solid phosphorus dopant source at a temperature sufficient to evolve $P_2O_5$ from the solid phosphorus dopant source for a time sufficient to form on the surface of the silicon wafer a phosphorus-containing layer of a desired thickness.

30. The method of claim 28, further comprising the step of:

selecting a solid dopant source from an aluminum metaphosphate dopant source, a rare earth metaphosphate dopant source, and a rare earth pentaphosphate dopant source.

* * * * *

UNITED STATES PATENT AND TRADEMARK OFFICE
CERTIFICATE OF CORRECTION

PATENT NO.   : 6,461,948 B1                                                      Page 1 of 1
DATED        : October 8, 2002
INVENTOR(S)  : James E. Rapp and Russell B. Rogenski It is certified that error appears in the above-identified patent and that said Letters Patent is hereby corrected as shown below:

<u>Column 14,</u>
Line 27, should read -- selected -- currently reads "elected"

Signed and Sealed this

Seventeenth Day of June, 2003

JAMES E. ROGAN
*Director of the United States Patent and Trademark Office*